United States Patent [19]

Uchida

[11] 4,453,234

[45] Jun. 5, 1984

[54] NONVOLATILE SEMICONDUCTOR MEMORY DEVICE

[75] Inventor: Yukimasa Uchida, Yokohama, Japan

[73] Assignee: Tokyo Shibaura Denki Kabushiki Kaisha, Japan

[21] Appl. No.: 302,776

[22] Filed: Sep. 16, 1981

[30] Foreign Application Priority Data

| Sep. 26, 1980 | [JP] | Japan | 55-134080 |
| Jun. 3, 1981 | [JP] | Japan | 56-84317 |
| Jun. 3, 1981 | [JP] | Japan | 56-84318 |
| Jun. 3, 1981 | [JP] | Japan | 56-84319 |

[51] Int. Cl.³ ........................................... G11C 11/40
[52] U.S. Cl. .................................. 365/185; 365/182; 352/23
[58] Field of Search ............... 365/174, 176, 182, 185; 357/23 VT

[56] References Cited

U.S. PATENT DOCUMENTS

| 3,919,711 | 11/1975 | Chow | 357/23 |
| 4,203,158 | 5/1980 | Frohman-Bentchkowsky | 365/185 |
| 4,209,849 | 6/1980 | Schrenk | 365/182 |

FOREIGN PATENT DOCUMENTS 2643948 3/1978 Fed. Rep. of Germany .
2743422 3/1979 Fed. Rep. of Germany .
2908796 7/1981 Fed. Rep. of Germany .

OTHER PUBLICATIONS

W. S. Johnson et al., "A 16Kb Electrically Erasable Nonvolatile Memory," 1980, IEEE International Solid-State Circuits Conference, pp. 152-153, (with continuation of p. 153), Feb. 14, 1980.

Primary Examiner—Joseph A. Popek
Attorney, Agent, or Firm—Finnegan, Henderson, Farabow, Garrett & Dunner

[57] ABSTRACT

A nonvolatile semiconductor memory device having floating gate type field effect transistors with floating gate electrodes. In the memory device, a source region, an active region and a drain region are formed in a first semiconductor region. A second semiconductor region is formed so as to electrically be insulated from the first semiconductor region. A floating gate electrode is formed on the first and second semiconductor regions with an insulating film interposed therebetween, respectively. The floating gate electrode faces the second semiconductor region with the insulating film interposed therebetween so that charge may be transferred between the floating gate electrode and second semiconductor region in order to control an amount of charge in the floating gate electrode.

18 Claims, 24 Drawing Figures

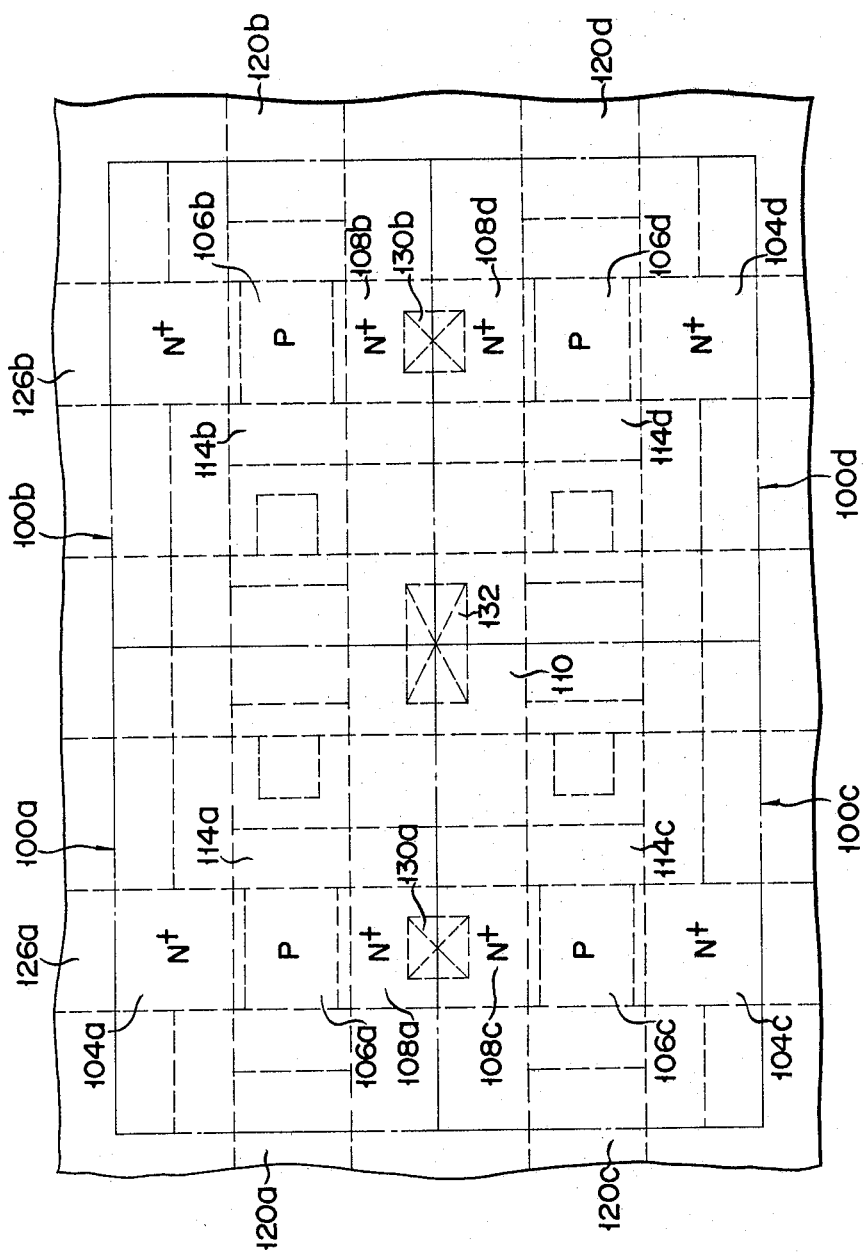

4,453,234

NONVOLATILE SEMICONDUCTOR MEMORY DEVICE

BACKGROUND OF THE INVENTION

The present invention relates to a nonvolatile semiconductor memory device with a floating gate.

In recent years, there has been an increasing demand of nonvolatile semiconductor memories of an electrically erasable type. The nonvolatile semiconductor memory is generally categorized into a MNOS (metal nitride oxide semiconductor) type memory and a floating gate type memory. The data-retention characteristic of the MNOS type memory deteriorates as temperature rises. Therefore it is inferior to that of the floating gate type memory. In this point, the floating gate type memory is most suitable for an electrically erasable nonvolatile semiconductor memory, so that study of the floating gate type memory is active.

In FIG. 1, there is shown a cross section of a floating gate type memory disclosed in "A 16 Kb Electrically Erasable Nonvolatile Memory" by W. S. Johnson, G. Perlegos, A. Renninger, Greg Kuhn and T. R. Ranganath, 1980 ISSCC Digest of Technical Papers, pp. 152–153, Feb., 1980. In the memory, a floating gate electrode 14 is formed on a P-type silicon substrate 10 with an insulating film 12 interposed therebetween. Source region 16 of N+type formed in the P-type silicon substrate 10 and the floating gate electrode 14 are oppositely disposed with insulating film 12 sandwiched therebetween. Drain region 18 of N+type formed in the P type silicon substrate 10 and the floating gate electrode 14 are also oppositely disposed with insulating film 12 sandwiched therebetween. A thin silicon oxide film of approximately 200 Å in thickness is formed between the drain region 18 and the floating gate electrode 14 in order to erase and write data through the transfer of charge between the drain region 18 and the floating gate electrode 14. In an erasing mode, voltage of about +20 V is applied to the drain region 18 and the control gate electrode 20 is set at 0 V. As a result, electrons are emitted, by the Fowler-Nordheim type tunnel effect, from the floating gate electrode 14 to the drain 18, thereby erased data. In a writing mode, the drain region 18 is set at 0 V and voltage of about +20 V is applied to the control gate electrode 20. As a result, electrons are injected, by the Fowler-Nordheim type tunnel effect, from the drain region 18 to the floating gate electrode 14, thereby effecting the data write.

However, the nonvolatile semiconductor device has the following disadvantages in miniaturing the semiconductor memory device. When the nonvolatile semiconductor cells (memory transistors) are miniaturized according to a scaling law, it is assumed that a high voltage of about 20 V would be applied to the drain region 18 formed of an N+diffusion region in order to erase data. In this case a punch through phenomenon tends to occur in which a depletion layer extends to between the drain and source regions 18 and 16 or a PN junction breakdown tends to occur between the drain region 18 and the silicon substrate 10. Consequently, the nonvolatile semiconductor memory can insufficiently be miniaturized. This hinders the increase of bit density and read speed of the semiconductor device.

In arranging a memory cell array by using the memory cells shown in FIG. 1, a selection transistor must additionally be provided for the drain region 18. The selection transistor also has a limit in the size reduction because the punch through phenomenon must be prevented. In this case, one memory cell must be formed by using two large transistors, so that an area required for one memory cell becomes larger.

SUMMARY OF THE INVENTION

Accordingly, an object of the present invention is to provide a nonvolatile semiconductor memory device with a high bit density and high read-out speed.

To achieve the above object, in a floating gate type transistor, a second semiconductor region is formed so as to be electrically insulated from a first semiconductor region including a source region, an active region and a drain region. Data write or erasure is performed by transferring charge between the second semiconductor region and the floating gate electrode.

With such an arrangement, the second semiconductor region for transferring charge to and from the floating gate electrode is completely enclosed by insulating material. Therefore the semiconductor memory cells can be miniaturized according to the scaling law, completely free from the punch through phenomenon or the PN junction breakdown between the drain region and the silicon substrate. Accordingly, a semiconductor device according to the invention has a high bit density and a high read-out speed.

By merely additionally using the second semiconductor region, the floating gate type transistor can effect data erasure without another transistor. This further improves the bit density of the nonvolatile semiconductor memory device.

BRIEF DESCRIPTION OF THE PREFERRED EMBODIMENT

Other objects and advantages of the invention will become apparent from the following detailed description when taken in conjunction with the accompanying drawings in which:

FIG. 9 shows another modification of a semiconductor memory device according to the present invention;

DETAILED DESCRIPTION OF THE PREFERRED EMBODIMENTS

Figure 1:
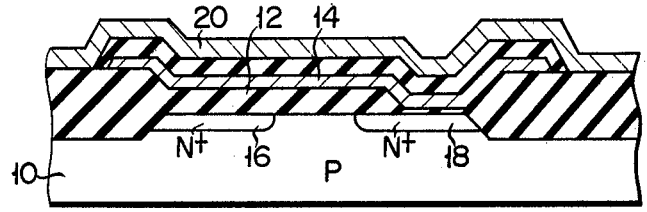
FIG. 1 shows a cross sectional view of a prior art floating gate type memory.
Figure 2:
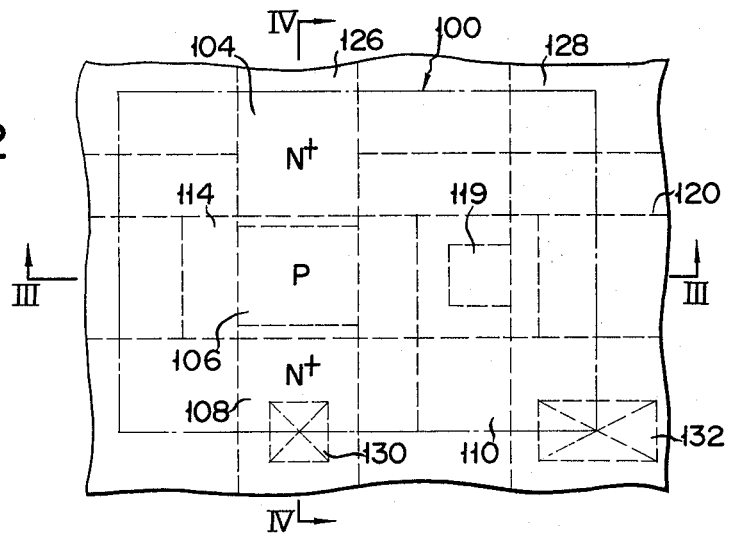
FIG. 2 is a plan view of a first embodiment of a semiconductor memory device according to the present invention.
Figure 3:
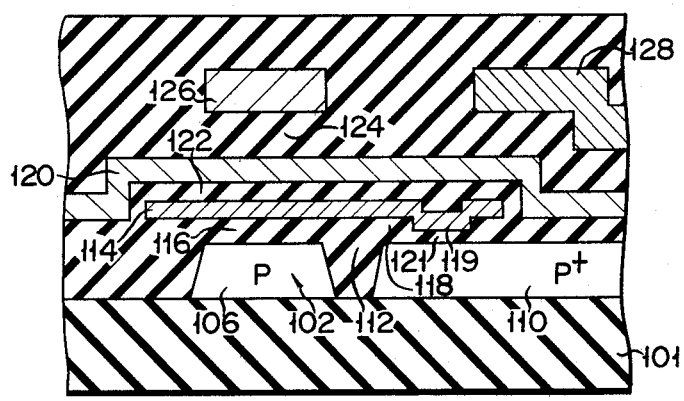
FIG. 3 is a cross sectional view taken along line III—III in FIG. 2.
Figure 4:
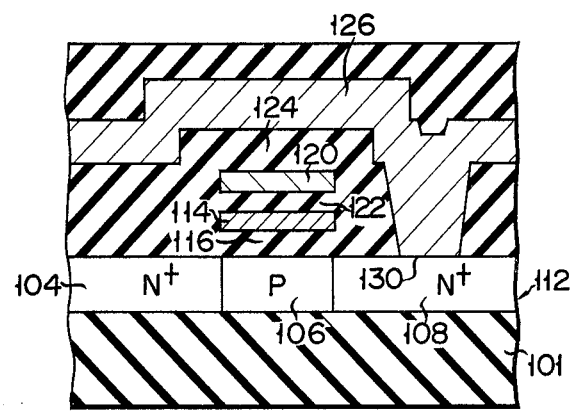
FIG. 4 is a cross sectional view taken along line IV—IV in FIG. 2.

A first embodiment of a nonvolatile semiconductor memory device according to the present invention will be described referring to FIGS. 2 to 4. FIG. 2 is a plan view of a memory cell 100 corresponding to one bit of a semiconductor memory device, FIG. 3 is a cross sectional view taken along line III—III in FIG. 2, and FIG. 4 is a cross sectional view taken along line IV—IV in FIG. 2. A first monocrystalline silicon island 102 with 0.5 $\mu$m in thickness including an N+ type source region 104, a P type active region 106 and an N+ type drain region 108 is formed on an insulating substrate 101 made of sapphire, for example. Further disposed on the insulating substrate 101 is a second monocrystalline silicon island 110 with 0.5 $\mu$m in thickness which is completely insulated from the first monocrystalline silicon island 102 by an insulating material 112. The second monocrystalline silicon island 110 serves as a later-described charge control terminal for a floating gate electrode. The active region 106 in the first monocrystalline silicon island 102 is a P type region containing impurity, for example, boron with $10^{16}$ cm$^{-3}$ in concentration. A floating gate electrode 114 of P- or N-type formed of polycrystalline silicon film with a 3000 Å in thickness is superposed on the active region 106 by interposing a first gate insulating film 116 formed of a silicon oxide film with a 500 Å in thickness between the floating gate electrode 114 and the active region 106. The second polycrystalline silicon island 110 is a P+ type region containing impurity of, for example, $10^{18}$ cm$^{-3}$ or more. The second monocrystalline silicon island 110 partially overlaps with the floating gate electrode 114 with a silicon oxide film 118 with 500 Å in thickness interposed therebetween. Specifically, the floating gate electrode 114 has a protrusive portion 119 extending over the second monocrystalline silicon island 110. A thin silicon oxide film 121 with about 150 Å in thickness is layered between the portion 119 and the island 110, as shown. A control gate electrode 120 of a polycrystalline silicon layer with a 4000 Å thickness is superposed on the floating gate electrode 114 by interposing a second gate insulating film 122 formed of a silicon oxide film with approximately 800 Å in thickness between the control gate electrode 120 and the floating gate electrode 114. Formed on the control gate electrode 120 is a field insulating film 124 as a silicon oxide film. A bit line 126 and a charge control line 128, which are made of aluminum, are wired over the field insulating film 124. The bit line 126 is connected to the drain region 108 at a contact region 130, while the charge control line 128 is connected to the second silicon island 110 at a contact region 132. The insulating substrate 101 may be an insulating layer with a spinel structure.

The operation of the semiconductor memory device thus constructed will be described. A state that electrons are injected into the floating gate electrode 114 is defined as information "1". Conversely, a state that electrons are discharged from the floating gate electrode 114 is defined as information "0". For writing the information "1" into the memory cell, 0 V is applied to the charge control line 128 and the potential at the silicon island 110 is set at 0 V. Then, a pulse voltage of +15 V with a 1 ms pulse width is applied to the control gate electrode 120. As a result, electrons are injected from the second silicon island 110 to the floating gate electrode 114 via the thin silicon oxide film 121 with about 150 Å thickness, so that the information "1" is loaded into the memory cell.

For writing the information "0" into the memory cell, a +15 V pulse voltage with a 1 ms pulse width is applied to the charge control line 128 while the control gate electrode 120 is kept at 0 V. As a result, electrons are discharged from the floating gate electrode 114 into the second silicon island 110 through the thin silicon film 121 with approximately 150 Å thickness, so that the information "0" is written into the memory cell. As a result of the write operation as mentioned above, a threshold voltage of a MOS transistor with a gate of the control electrode 120, the source region 104 and the drain region 108 is +6 V for the information "1" and +1 V for the information "0".

Figure 5:
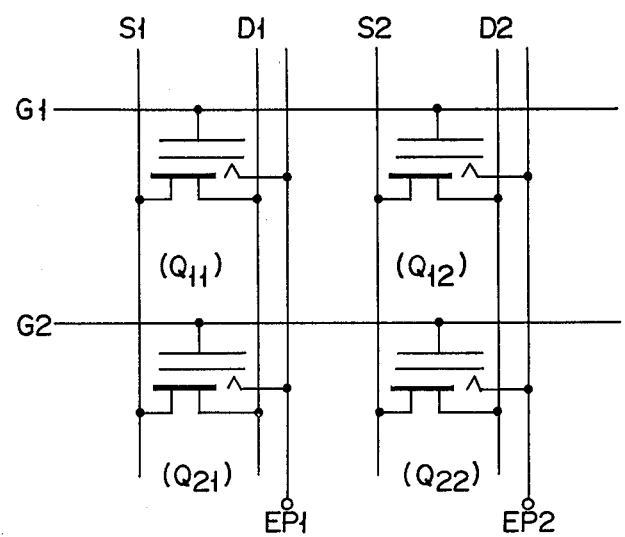
FIG. 5 is a circuit diagram of a memory array according to the present invention.

In FIG. 5, there is shown a circuit corresponding to a 4-bit memory array of 2 rows×2 columns embodying the first embodiment according to the present invention. As shown, the control gate electrode of a memory cell Qij is connected to a common selection line Gi provided for each row of the memory array. The drain region is connected to a common drain line Dj for each column. The second silicon island is connected to a common charge control line EPj for each column. The drain line Dj is formed by the bit line. The source region of the memory cell Qij is connected to a source line Si arranged for each row or column.

Figure 6:
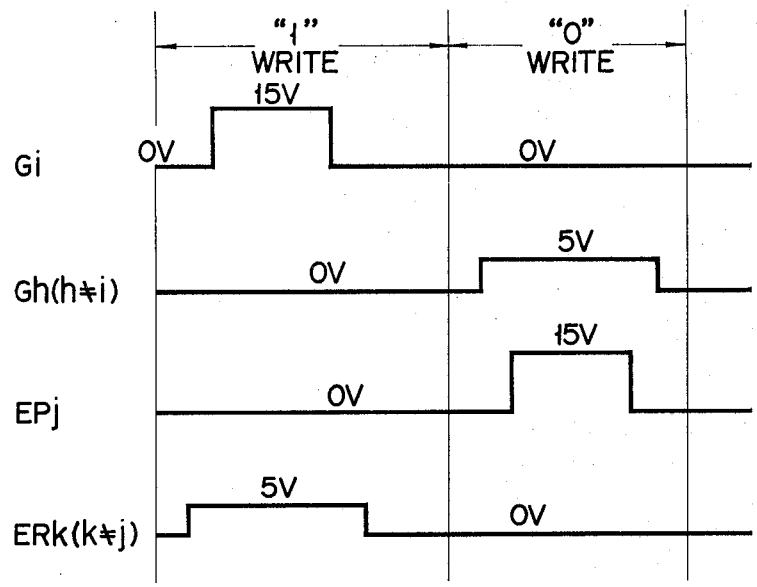
FIG. 6 is a timing chart useful in explaining the operation of a selective write operation of the memory array shown in FIG. 5.

A selective write operation of the memory cell array shown in FIG. 5 will be described referring to a timing chart shown in FIG. 6. For selectively writing the information "1" into the memory cell Qij, the corresponding charge control line EPj is set at 0 V. A charge control line EPk (k≠j) not related to the memory cell Qij is set at 5 V. A 15 V pulse is applied to only the corresponding selection line Gi. A selection line Gh (h≠i) not related to the memory cell Qij is set at 0 V. Under this condition, electrons are injected into the floating gate electrode of the selected memory cell Qij in accordance with the principle as mentioned above. In this way, the information "1" is loaded into the memory cell. For writing the information "0" into the memory cell Qij, the corresponding selection line Gi is set at 0 V. A selection line Gh (h≠i) not related to the memory cell is set at 5 V. A 15 V voltage pulse is applied to only the corresponding charge control line EPj. A charge control line EPk (k≠j) is set at 0 V. Under this condition, electrons are discharged from the floating gate electrode corresponding to the selected memory cell Qij, with the result that the information "0" is loaded into the memory cell Qij.

In FIG. 5, the 4-bit memory array is illustrated. It will be understood, however, that the semiconductor memory device of the invention is applicable for an N-bit memory array.

With the above-mentioned structural arrangement of the memory device, the second silicon island is completely insulated. Accordingly, the floating gate type MOS transistor in the memory device is free from the punch through phenomenon or the PN junction breakdown. Therefore, the memory device can remarkably be miniaturized in accordance with the scaling law, thereby providing nonvolatile semiconductor memory device with high bit density and high read-out speed. By merely additionally using the second silicon island which can easily be formed small in size by the insulating separation, the floating gate type MOS transistor can independently be erased electrically without another MOS transistor. This feature provides the nonvolatile semiconductor memory device with further improved bit density.

Figure 7:
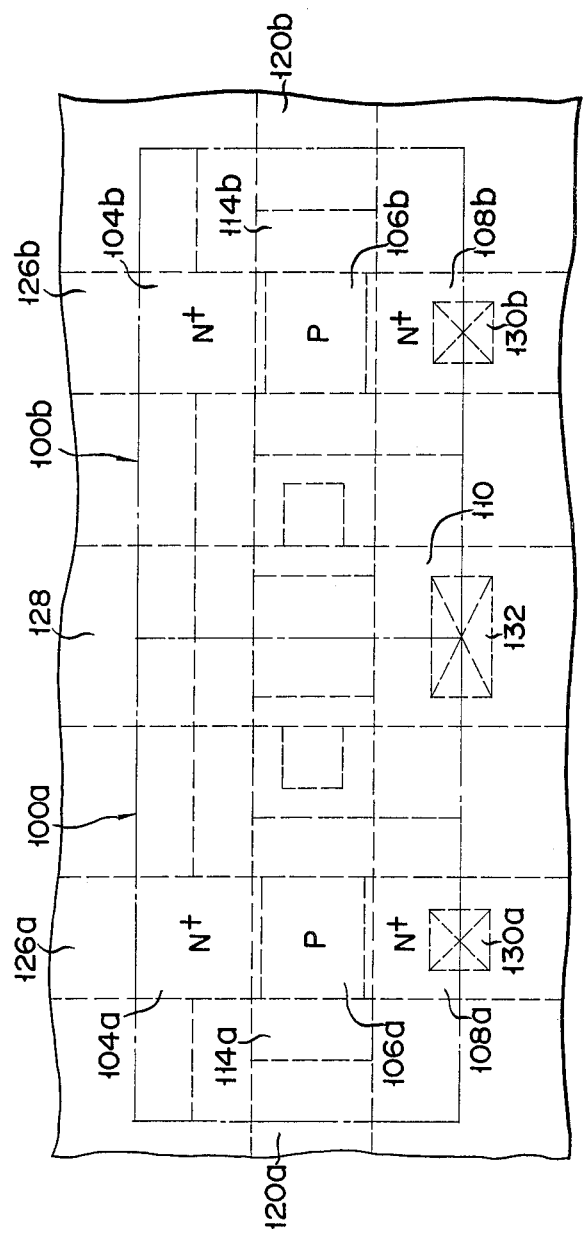
FIG. 7 is a modification of a semiconductor memory device according to the present invention.

Turning to FIG. 7, there is shown a modification of the first embodiment of the semiconductor memory device of the present invention, in which the second silicon island 110 is commonly used for two memory cells 100a and 100b. The memory cell 100a is comprised of an N+ type source region 104a, a P type active region 106a, an N+ type drain region 108a, a floating gate electrode 114a and a control gate electrode 120a. The memory cell 100b is comprised of an N+ type source region 104b, a P type active region 106b, an N+ type drain region 108b, a floating gate electrode 114b, and a control gate electrode 120b. A second silicon island 110 for writing the information into the floating gate electrodes 114a and 114b of the memory cells 100a and 100b respectively, are provided commonly for the two memory cells 100a and 100b. The second silicon island 110 is connected to the charge control line 128 at a contact area 132. The drain region 108a of the memory cell 100a is connected to the bit line 126a at a contact area 130a. The drain region 108b of the memory cell 100b is connected to the bit line 126b at a contact area 130b.

Figure 8:
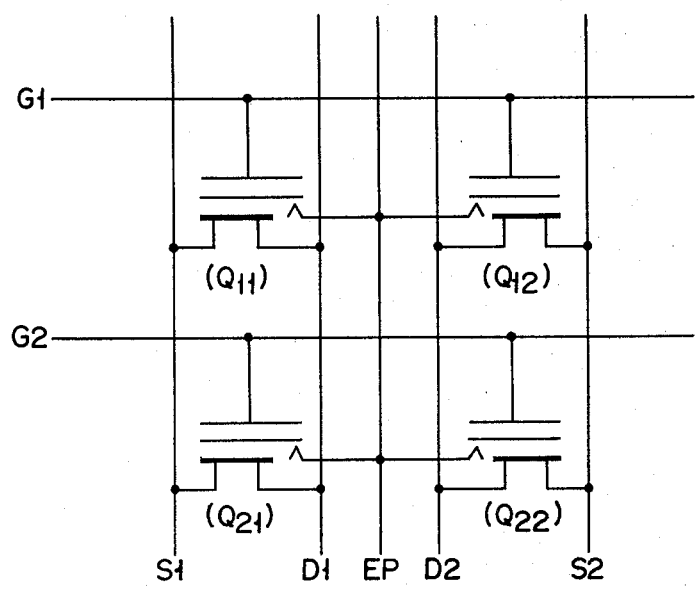
FIG. 8 is a circuit diagram of the semiconductor memory device of the present invention shown in FIG. 7.

FIG. 8 shows a memory array circuit of a 4-bit memory array with 2 rows×2 columns to which the present invention is applied. As shown, the control gate of a memory cell Qij is connected to a common selection line Gi provided for each row of the memory array. The drain region of each memory cell Qij is connected to a common drain line Dj for each column. The second silicon island common for memory cells Q11 and Q12 and the second silicon island common for memory cells Q21 and Q22 are connected to a charge control line EPj common for two adjacent columns. The source region of the memory cell Qij is connected to a source line Si arranged for each row or column.

As shown in FIG. 9 illustrating another modification of the semiconductor memory device, the second silicon island may be commonly provided for four memory cells 100a, 100b, 100c and 100d. The first memory cell 100a is made up of an N+ type source region 104a, a P type active region 106a, N+ type drain region 108a, a floating gate electrode 114a, and a control gate electrode 120a. The second memory cell 100b is made up of an N+ type source region 104b, a P type active region 106b, an N+ type drain region 108b, a floating gate electrode 114b and a control gate electrode 120b. The third memory cell 100c is made up of an N+ type source region 104c, a P type active region 106c, an N+ type drain region 108c, a floating gate electrode 114c, and a control gate electrode 120c. The fourth memory cell 100d is comprised of an N+ type source region 104d, a P type active region 106d, an N+ drain region 108d, a floating gate electrode 114d, and a control gate electrode 120d. A second silicon island 110 for writing the information into the floating gate electrodes 114a, 114b, 114c and 114d of the memory cells 100a, 100b, 100c and 100d, respectively, is provided commonly for the four memory cells 100a, 100b, 100c and 100d. The second silicon island 110 is connected to the charge control line 128 at a contact area 132. The drain regions 108a and 108c of the first and third memory cells 100a and 100c, respectively, are connected to the bit line 126a at a contact area 130a. The drain regions 108b and 108d of the second and fourth memory cells 100b and 100d, respectively, are connected to the bit line 126b at a contact area 130b.

The first and second silicon islands in the above-mentioned embodiments can easily be made of monocrystalline silicon by an SOS (silicon on sapphire) technology. An oxide film with a constant thickness can be formed on the monocrystalline silicon. For this reason, it is advisable that the first and second silicon islands should be made of monocrystalline silicon in order to improve a film quality.

Figure 10:
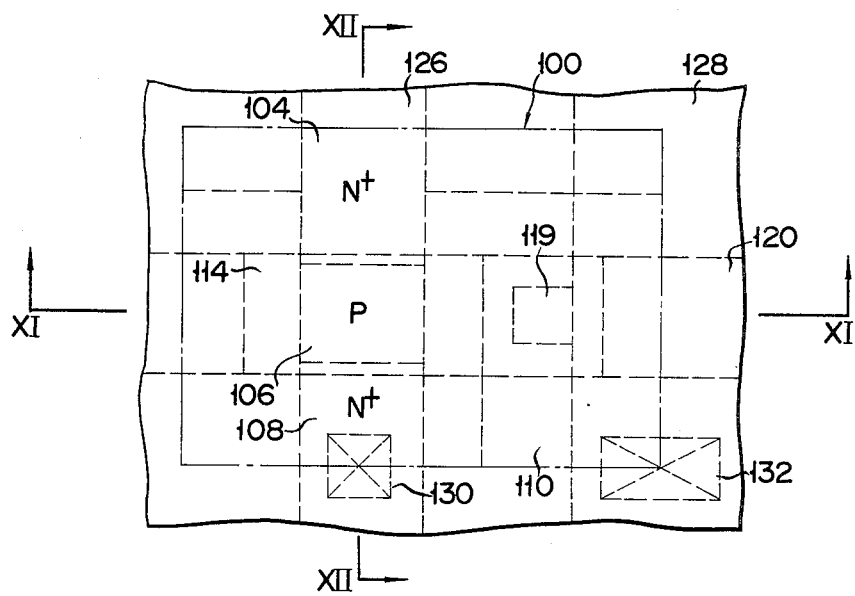
FIG. 10 is a plan view of a second embodiment of a semiconductor device according to the present invention.
Figure 11:
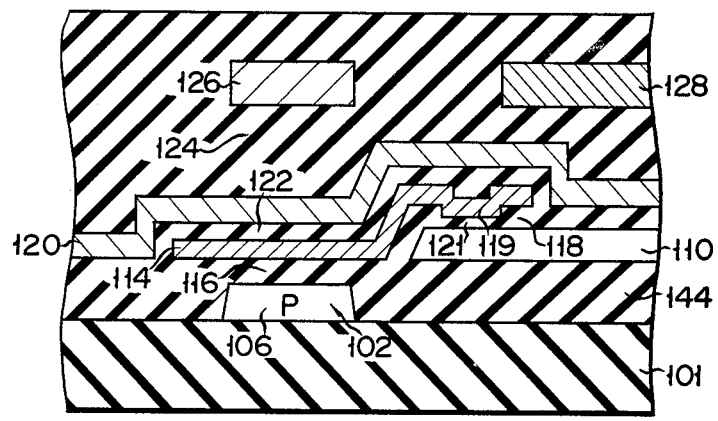
FIG. 11 is a cross sectional view taken along line XI—XI in FIG. 10.
Figure 12:
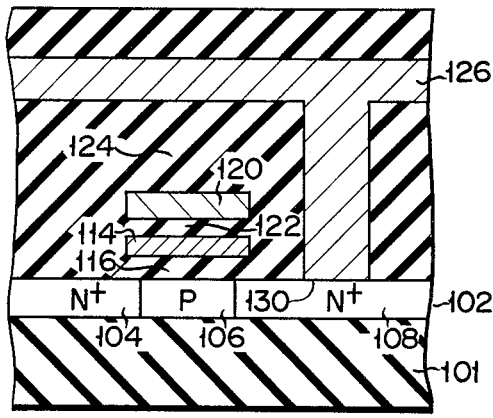
FIG. 12 is a cross sectional view taken along line XII—XII in FIG. 10.

A second embodiment of a nonvolatile semiconductor memory according to the present invention will be described referring to FIGS. 10 to 12. FIG. 10 is a plan view of a memory cell 100 of one bit in the semiconductor memory device. FIG. 11 is a cross sectional view taken along line XI—XI shown in FIG. 10. FIG. 12 is a cross sectional view taken along line XII—XII in FIG. 10. A first monocrystalline silicon island 102 with 0.5 μm in thickness including an N+ type source region 104, a P type active region 106, and an N+ type drain region 108 is formed on an insulating substrate 101 made of sapphire. A second monocrystalline silicon island 110 with a 0.5 μm thickness is formed above the insulating substrate 101 with a separation insulating material 144 interposed therebetween, by a graphoepitaxy process. The second monocrystalline silicon island 110 serves as a charge control terminal of the floating gate electrode. The active region 106 in the first monocrystalline silicon island 102 is a P type region containing impurity of, for example, boron with a concentration of $10^{16}$ cm$^{-3}$. Formed on the active region 106 is a P- or N-type floating gate electrode 114 with a 3000 Å thickness by intervening a first gate insulating film 116 as an oxide silicon film with a 500 Å thickness between the active region 106 and the floating gate electrode 114. The second monocrystalline silicon island 110 is formed as a P+ type region containing impurity of boron of $10^{18}$ cm$^{-3}$ or more. The second monocrystalline silicon island 110 partially overlaps with the floating gate electrode 114 with an oxide silicon film 118 of 500 Å in thickness interposed therebetween. More specifically, the floating gate electrode 114 has a protrusive portion 119 extending over the second monocrystalline silicon island 110.

A thin oxide silicon film 121 with about 150 Å in thickness is layered between the portion 119 and the island 110, as shown. A control gate electrode 120 as a polycrystalline silicon layer with a 4000 Å thickness is superposed on the floating gate electrode 114 by interposing a second gate insulating film 122 formed of a silicon oxide film with approximately 800 Å in thickness between the control gate electrode 120 and the floating gate electrode 114. Formed on the control gate electrode 120 is a field insulating film 124 as a silicon oxide film. A bit line 126 and a charge control line 128, which are made of aluminium, are wired over the field insulating film 124. The bit line 126 is connected to the drain region 108 at a contact region 130, while the charge control line 128 is connected to the second silicon island 110 at a contact region 132. The second monocrystalline silicon island 110 may of course be formed over the first monocrystalline silicon island 102 with an insulating film interposed therebetween.

Figure 13:
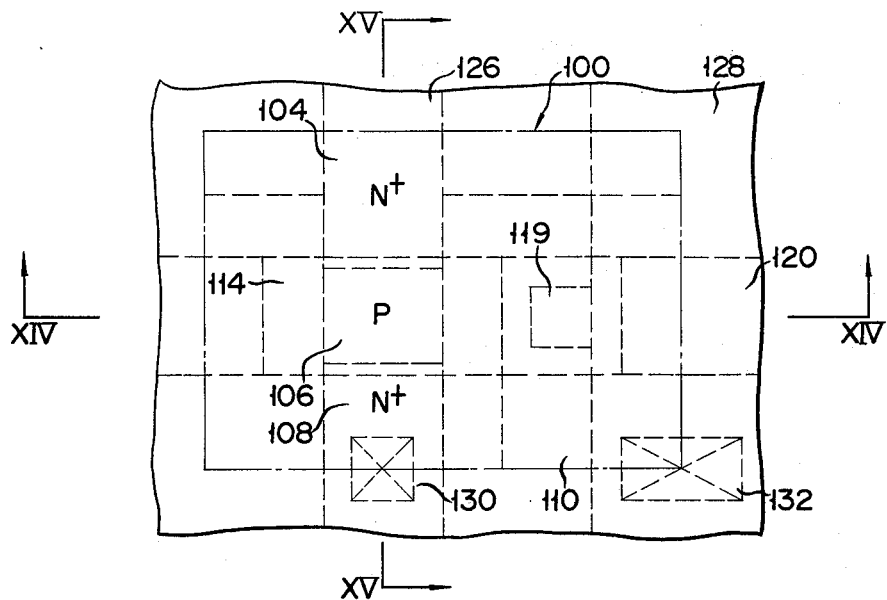
FIG. 13 is a plan view of a third embodiment of a semiconductor memory device according to the present invention.
Figure 14:
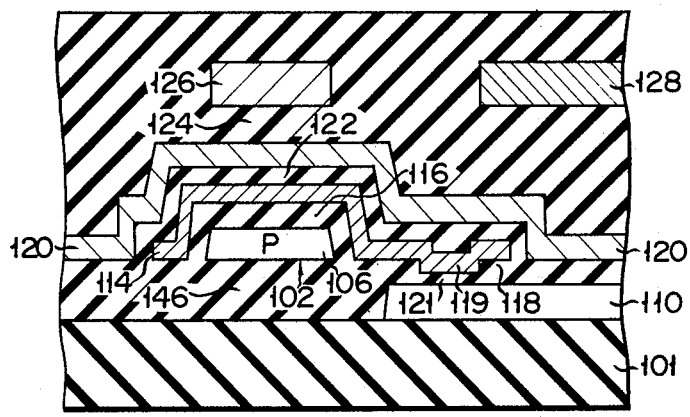
FIG. 14 is a cross sectional view taken along line XIV—XIV in FIG. 13.
Figure 15:
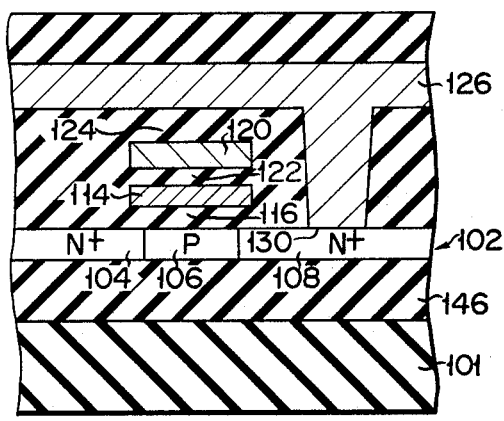
FIG. 15 is a cross sectional view taken along line XV—XV in FIG. 13.

A third embodiment of a nonvolatile semiconductor memory device according to the present invention will be described referring to FIGS. 13 to 15. FIG. 13 is a plan view of a memory cell 100 of one bit in a semiconductor memory device, FIG. 14 is a cross sectional view taken along line XIV—XIV in FIG. 13, and FIG. 15 is a cross sectional view taken along line XV—XV in FIG. 13. Firstly, a second silicon island 110, serving as a charge control terminal of the floating gate electrode, is formed on an insulating substrate 101 made of sapphire. Secondly, a silicon oxide film 146 for insulating separation is formed on the insulating substrate 101 except the area of the substrate having the second silicon island 110 formed thereon. Then, a first monocrystalline silicon island 102 with a 0.5 μm thickness is formed on the silicon oxide film 146 by the graphoepitaxy technique. The first monocrystalline silicon island 102 is comprised of an N+ type source region 104, a P type active region 106, and an N+ type drain region 108. The first silicon island 102 is completely electrically insulated from the second silicon island 110. The active region 106 in the first silicon island 102 is a P type region containing impurity of, for example, boron of $10^{16}$ cm$^{-3}$ in concentration. A P- or N-type floating gate electrode 114 as a polycrystalline silicon film with 3000 Å in thickness is formed over the active region 106 with a first gate insulating film 116 of a 500 Å-thickness silicon oxide film interposed therebetween. The second monocrystalline silicon island 110 is a P+ type region containing impurity of, for example, boron of $10^{18}$ cm$^{-3}$ or more. The second monocrystalline silicon island 110 partially overlaps with the floating gate electrode 114 with a silicon oxide film 118 of 500 Å in thickness interposed therebetween. Specifically, the floating gate electrode 114 has a protrusive portion 119 extending over the second monocrystalline silicon island 110. A thin silicon oxide film 121 with about 150 Å in thickness is layered between the portion 119 and the island 110, as shown. A control gate electrode 120 of a polycrystalline silicon layer with a 4000 Å thickness is formed on the floating gate electrode 114 by interposing a second gate insulating film 122 formed of a silicon oxide film with approximately 800 Å in thickness between the control gate electrode 120 and the floating gate electrode 114. Formed on the control gate electrode 120 is a field insulating film 124 as a silicon oxide film. A bit line 126 and a charge control line 128, which are made of aluminum, are wired over the field insulating film 124. The bit line 126 is connected to the drain region 108 at a contact region 130, while the charge control line 128 is connected to the second silicon island 110 at a contact region 132.

Figure 16:
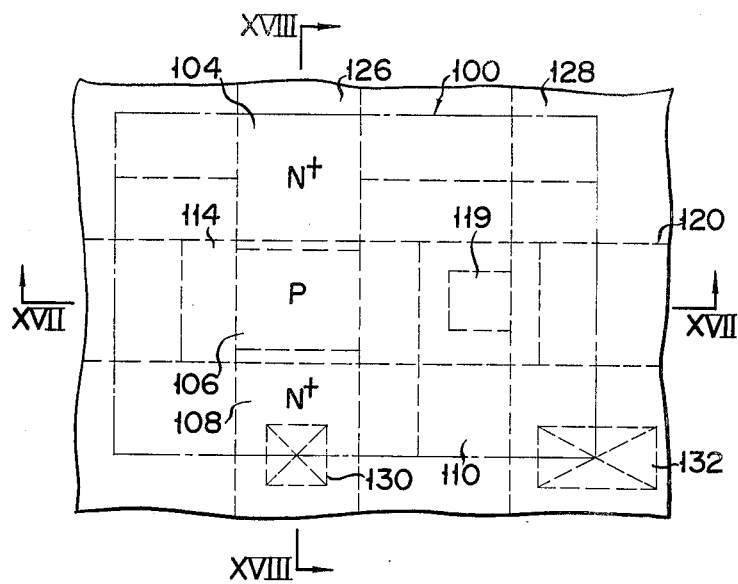
FIG. 16 is a plan view of a fourth embodiment of a semiconductor memory device according to the present invention.
Figure 17:
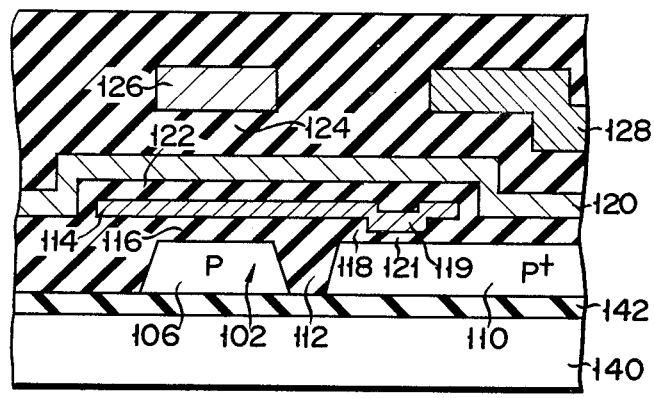
FIG. 17 is a cross sectional view taken along line XVII—XVII in FIG. 16.
Figure 18:
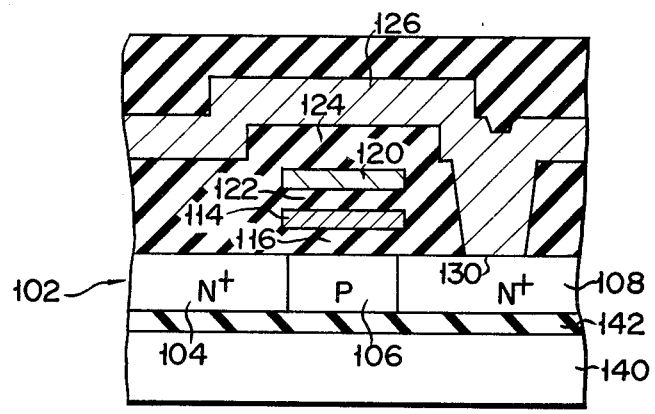
FIG. 18 is a cross sectional view taken along line XVIII—XVIII in FIG. 16.

A fourth embodiment of a nonvolatile semiconductor memory device according to the present invention will be described referring to FIGS. 16 to 18. FIG. 16 is a plan view of a memory cell of one bit in the semiconductor memory device, FIG. 17 is a cross sectional view taken along line XVII—XVII in FIG. 16, and FIG. 18 is a cross sectional view taken along line XVIII—XVIII in FIG. 16. An insulating layer 142 of SiO$_2$, for example, is formed on a semiconductor substrate 140 of a proper conductivity type. A first monocrystalline silicon island 102 with 0.5 μm in thickness comprised of a source region 104, an active region 106, and a drain region 108 is formed on the insulating layer 142. Further formed on the insulating layer 142 is a second monocrystalline silicon island 110 with a 0.5 μm thickness which is completely insulated from the first monocrystalline silicon island 102 by an insulating material 112. The second monocrystalline silicon island 110 serves as a charge control terminal of the floating gate electrode. The active region 106 in the first silicon island 102 is a P type region containing impurity of, for example, boron of $10^{16}$ cm$^{-3}$ in concentration. A P- or N-type floating gate electrode 114 as a polycrystalline silicon film of 3000 Å in thickness is formed over the active region 106 by interposing a first gate insulating film 116 of a 500 Å-thickness silicon oxide film between the floating gate electrode 114 and the active region 106. The second monocrystalline silicon island 110 is a P+ type region containing impurity of, for example, boron of $10^{18}$ cm$^{-3}$ or more. The second monocrystalline silicon island 110 partially overlaps with the floating gate electrode 114 with an oxide silicon film 118 of 500 Å in thickness interposed therebetween. Specifically, the floating gate electrode 114 has a protrusive portion 119 extending over the second monocrystalline silicon island 110. A thin silicon oxide film 121 of about 150 Å in thickness is layered between the portion 119 and the island 110, as shown. A control gate electrode 120 as a polycrystalline silicon layer with a 4000 Å thickness is superposed on the floating gate electrode 114 by interposing a second gate insulating film 122 formed of a silicon oxide film with approximately 800 Å in thickness between the control gate electrode 120 and the floating gate electrode 114. Formed on the control gate electrode 120 is a field insulating film 124 as a silicon oxide film. A bit line 126 and a charge control line 128, which are made of aluminum, are wired over the field insulating film 124. The bit line 126 is connected to the drain region 108 at a contact region 130, while the charge control line 128 is connected to the second silicon island 110 at a contact region 132. It is evident that an Si$_3$N$_4$ (silicon nitride) film in place of the SiO$_2$ film may be used for the insulating layer 142.

Figure 19:
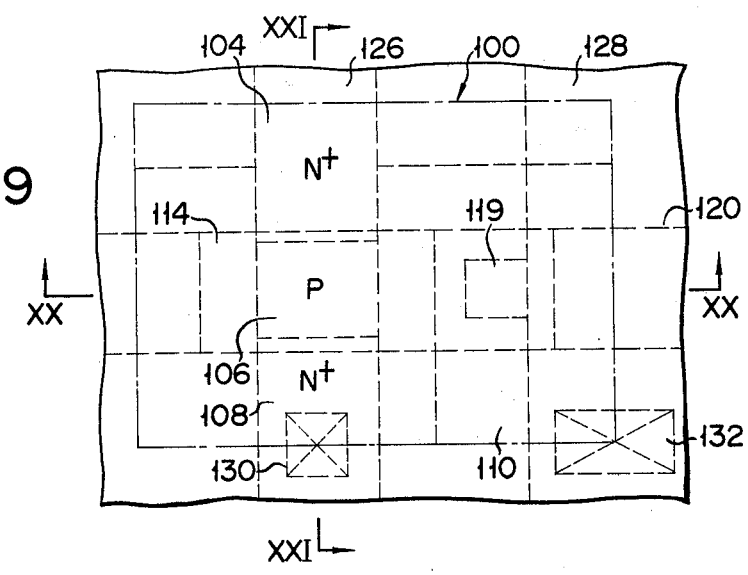
FIG. 19 is a plan view of a fifth embodiment of a semiconductor memory device according to the present invention.
Figure 20:
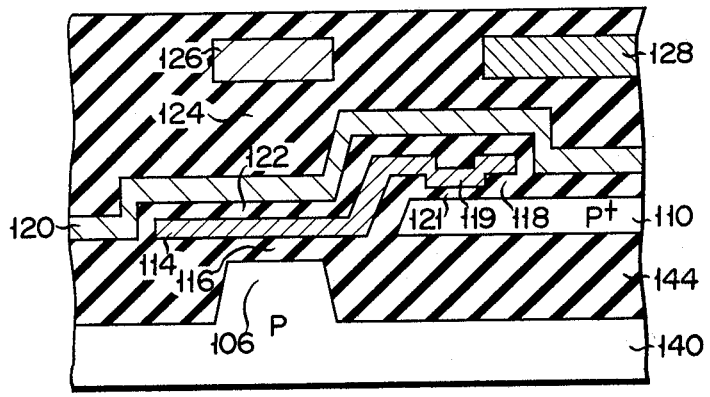
FIG. 20 is a cross sectional view taken along line XX—XX in FIG. 19.
Figure 21:
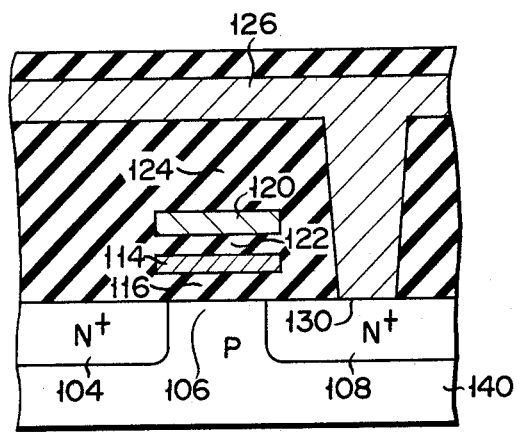
FIG. 21 is a cross sectional view taken along line XXI—XXI shown in FIG. 19.

A fifth embodiment of a nonvolatile semiconductor memory device will be described referring to FIGS. 19 to 21. FIG. 19 is a plan view of a memory cell of one bit in the semiconductor memory device, FIG. 20 is a cross sectional view taken along line XX—XX in FIG. 19, and FIG. 21 is a cross sectional view taken along line XXI—XXI in FIG. 19. A source region 104, an active region 106 and a drain region 108 are formed on a P type semiconductor substrate 140. An insulating material 144 made of silicon oxide is formed on the semiconductor substrate 140 in order to separate a monocrystalline silicon island 110 from the semiconductor substrate 140. The monocrystalline silicon island 110 with 0.5 μm in thickness is formed on the separation insulating material 144 by the graphoepitaxy technique. The monocrystalline silicon island 110 serves as a charge control terminal of the floating gate electrode. The active region 106 near the surface of the P type semiconductor substrate 140 is a P type region containing impurity of, for example, boron of $10^{16}$ cm$^{-3}$. A P- or N-type floating gate electrode 114 as a polycrystalline silicon film of 3000 Å in thickness is formed on the active region 106 by interposing a first gate insulating film 116 of a 500 Å-thickness silicon oxide film between the floating gate electrode 114 and the active region 106. The monocrystalline silicon island 110 is a P+ type region containing impurity of, for example, boron of $10^{18}$ cm$^{-3}$ or more. The monocrystalline silicon island 110 partially overlaps with the floating gate electrode 114 with a silicon oxide film 118 of 500 Å in thickness interposed therebetween. Specifically, the floating gate electrode 114 has a protrusive portion 119 extending over the monocrystalline silicon island 110. A thin silicon oxide film 121 with about 150 Å in thickness is layered between the portion 119 and the island 110, as shown. A control gate electrode 120 as a polycrystalline silicon layer with a 4000 Å thickness is superposed on the floating gate electrode 114 by interposing a second gate insulating film 122 formed of a silicon oxide film with approximately 800 Å in thickness between the control gate electrode 120 and the floating gate electrode 114. Formed on the control gate electrode 120 is a field insulating film 124 as a silicon oxide film. A bit line 126 and a charge control line 128, which are made of aluminum, are wired over the field insulating film 124. The bit line 126 is connected to the drain region 108 at a contact region 130, while the charge control line 128 is connected to the silicon island 110 at a contact region 132. A silicon nitride film or a silicon oxide-silicon nitride film in place of the silicon oxide film may be used for the separation insulating material 144.

Although the silicon island 110 may be made of polycrystalline silicon, it can be easily made of a monocrystalline silicon by the above-mentioned graphoepitaxy technique. In this case, an oxide film with uniform thickness can be formed on the monocrystalline silicon.

Figure 22:
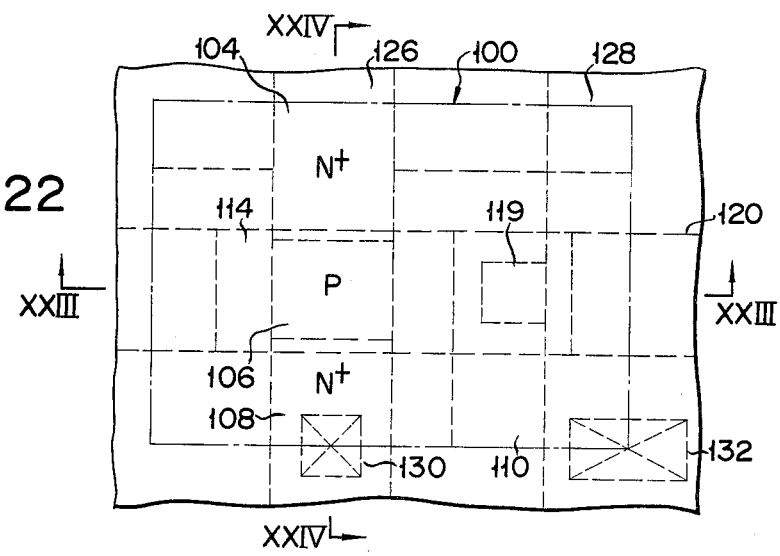
FIG. 22 is a plan view of a sixth embodiment of a semiconductor memory device according to the present invention.
Figure 23:
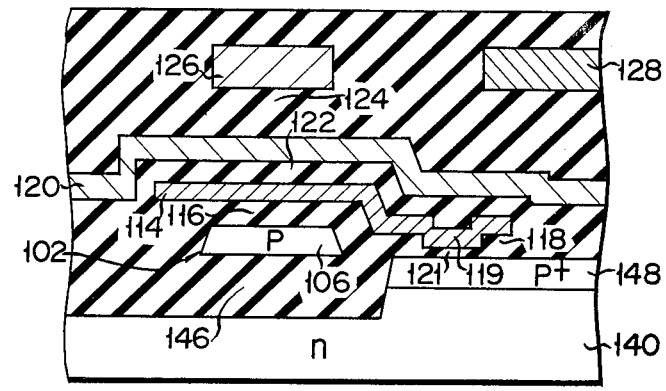
FIG. 23 is a cross sectional view taken along line XXIII—XXIII in FIG. 22.
Figure 24:
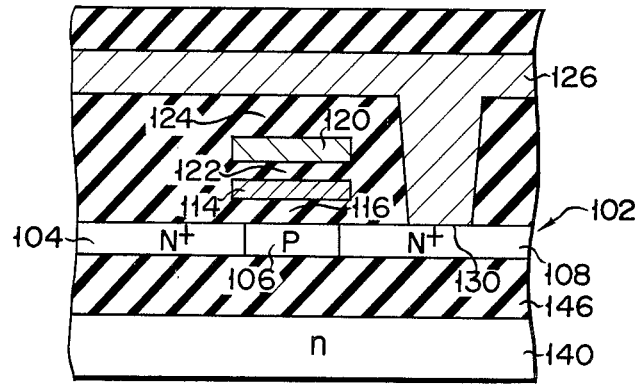
FIG. 24 is a cross sectional view taken along line XXIV—XXIV in FIG. 22.

A sixth embodiment of a nonvolatile semiconductor memory device according to the present invention will be described referring to FIGS. 22 to 24. FIG. 22 is a plan view of a memory cell of one bit in the semiconductor memory device, FIG. 23 is a cross sectional view taken along line XXIII—XXIII in FIG. 22, and FIG. 24 is a cross sectional view taken along line XXIV—XXIV in FIG. 22. A separation silicon oxide 146 is formed on an N type semiconductor substrate 140. A monocrystalline silicon island 102 with a 0.5 μm thickness including a source region 104, an active region 106 and a drain region 108 is formed on the separation silicon oxide film 146 by the graphoepitaxy technique. A P type impurity-diffused region 148 is formed in the surface of the semiconductor substrate 140 by the impurity diffusion process. The impurity-diffused region 148 serves as a charge control terminal of the floating gate electrode. The active region 106 in the silicon island 102 is a P type region containing impurity of, for example, boron of $10^{16}$ cm$^{-3}$ in density. A P- or N-type floating gate electrode 114 as a polycrystalline silicon film of 3000 Å in thickness is formed over the active region 106 by interposing a first gate insulating film 116 formed of a 500 Å-thickness silicon oxide film between the floating gate electrode 114 and the active region 106. The impurity-diffused region 148 is a P+ type region containing impurity of, for example, boron of $10^{18}$ cm$^{-3}$ or more. The impurity-diffused region 148 partially overlaps with the floating gate electrode 114 with a silicon oxide film 118 of 500 Å in thickness interposed therebetween. Specifically, the floating gate electrode 114 has a protrusive portion 119 extending over the impurity-diffused region 148. A thin silicon oxide film 121 with about 150 Å in thickness is layered between the portion 119 and the impurity-diffused region 148, as shown. A control gate electrode 120 as a polycrystalline silicon layer with a 4000 Å thickness is superposed on the floating gate electrode 114 by interposing a second gate insulating film 122 formed of a silicon oxide film of approximately 800 Å in thickness between the control gate electrode 120 and the floating gate electrode 114. Formed on the control gate electrode 120 is a field insulating film 124 as a silicon oxide film. A bit line 126 and a charge control line 128, which are made of aluminum, are wired over the field insulating film 124. The bit line 126 is connected to the drain region 108 at a contact region 130, while the charge control line 128 is connected to the impurity-diffused region 148 at a contact region 132.

What is claimed is:

1. A nonvolatile semiconductor memory device comprising:
   a first semiconductor region in which a source region, an active region and a drain region are formed;
   a second semiconductor region;
   insulator means for spacing apart said first semiconductor region from said second semiconductor region with insulating material;
   a first insulating film superposed on said first and second semiconductor regions;
   a floating gate electrode superposed over said first and second semiconductor regions with said first insulating film interposed therebetween, said floating gate electrode facing said second semiconductor region with said first insulating film interposed therebetween so that charge may be transferred between said floating gate electrode and said second semiconductor region in order to control an amount of charge in said floating gate electrode;
   a second insulating film superposed on said floating gate electrode; and
   a control gate electrode formed over said floating gate electrode with said second insulating film interposed therebetween.

2. A nonvolatile semiconductor memory device according to claim 1, wherein said insulator means for insulating includes an insulating substrate upon which said first and second semiconductor regions are formed spaced apart from each other and a third insulating film located between said first and second semiconductor regions.

3. A nonvolatile semiconductor memory device according to claim 2, wherein said insulating substrate is of insulating sapphire or a spinel structure.

4. A nonvolatile semmiconductor memory device according to claim 2 or 3, wherein said first and second semiconductor regions are both made of monocrystalline silicon.

5. A nonvolatile semiconductor memory device according to claim 1, wherein said insulating means includes an insulating substrate and a third insulating film formed on a portion of said substrate, with said first semiconductor region formed on said insulating substrate and said second semiconductor region formed on said third insulating film.

6. A nonvolatile semiconductor memory device according to claim 5, wherein said insulating substrate is of insulating sapphire or a spinel structure.

7. A nonvolatile semiconductor memory device according to claim 5 or 6, wherein said first and second semiconductor regions are both made of monocrystalline silicon.

8. A nonvolatile semiconductor memory device according to claim 1, wherein said insulator means includes an insulating substrate and a third insulating film formed on a portion of said substrate, with said first semiconductor region formed on said third insulating film and said second semiconductor region formed on said insulating substrate.

9. A nonvolatile semiconductor memory device according to claim 8, wherein said insulating substrate is of insulating sapphire or a spinel structure.

10. A nonvolatile semiconductor memory device according to claim 8 or 9, wherein said first and second semiconductor regions are both made of monocrystalline silicon.

11. A nonvolatile semiconductor memory device according to claim 1 including a semiconductor substrate and wherein said insulator means includes a third insulating film, with said first and second semiconductor regions formed on said third insulating film so as to be spaced apart from each other and from said semiconductor substrate by insulating material.

12. A nonvolatile semiconductor memory device according to claim 11, wherein said third insulating film is made of a silicon oxide or silicon nitride.

13. A nonvolatile semiconductor memory device according to claim 11 or 12, wherein said first and second semiconductor regions are both made of monocrystalline silicon.

14. A nonvolatile semiconductor memory device according to claim 1 including a semiconductor substrate and wherein said insulator means includes a third insulating film, with said first semiconductor region formed in said semiconductor substrate and said second semiconductor region formed on said third insulating film so as to be spaced apart from said first semiconductor region by insulating material.

15. A nonvolatile semiconductor memory device according to claim 14, wherein said second semiconductor region is made of monocrystalline silicon.

16. A nonvolatile semiconductor memory device according to claim 1 including a semiconductor substrate and wherein said insulator means includes a third insulating layer, with said second semiconductor region formed in said semiconductor substrate and said first semiconductor region formed on said third insulating film so as to be spaced apart from said second semiconductor region by insulating material.

17. A nonvolatile semiconductor memory device according to claim 16, wherein said first semiconductor region is made of monocrystalline silicon.

18. A nonvolatile semiconductor memory device according to claim 1, 2, 5, 8, 11, 14 or 16, wherein said second semiconductor region is used as charge injecting means common for a plurality of floating gate electrodes of floating gate type MOS transistors.

* * * * *